(12) United States Patent
Yang et al.

(10) Patent No.: US 10,521,048 B2
(45) Date of Patent: Dec. 31, 2019

(54) TOUCH WINDOW AND TOUCH DEVICE INCLUDING THE SAME

(71) Applicant: LG INNOTEK CO., LTD., Seoul (KR)

(72) Inventors: Joon Hyuk Yang, Seoul (KR); Jae Hong Lee, Seoul (KR); Yu Hong Jeon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/383,038

(22) Filed: Apr. 12, 2019

(65) Prior Publication Data

US 2019/0235697 A1 Aug. 1, 2019

Related U.S. Application Data

(63) Continuation of application No. 16/106,454, filed on Aug. 21, 2018, now Pat. No. 10,303,292, which is a
(Continued)

(30) Foreign Application Priority Data

Jan. 13, 2014 (KR) .................. 10-2014-0004112

(51) Int. Cl.
  *G06F 3/041* (2006.01)
  *G06F 3/044* (2006.01)
  (Continued)

(52) U.S. Cl.
  CPC .......... *G06F 3/0416* (2013.01); *G06F 1/1652* (2013.01); *G06F 3/044* (2013.01);
  (Continued)

(58) Field of Classification Search
  CPC ................ G06F 3/044; G06F 3/0416; G06F 2203/04102; G06F 2203/04111;
  (Continued)

(56) References Cited

U.S. PATENT DOCUMENTS

2011/0063814 A1* 3/2011 Nimura ................ H05K 9/0067
  361/796
2012/0256199 A1 10/2012 Lee et al.
  (Continued)

FOREIGN PATENT DOCUMENTS

| CN | 104238782 | 12/2014 |
|---|---|---|
| KR | 10-0902211 | 6/2009 |

(Continued)

OTHER PUBLICATIONS

U.S. Office Action dated Aug. 2, 2016 issued in co-pending U.S. Appl. No. 14/595,363.
(Continued)

*Primary Examiner* — Mark Edwards
(74) *Attorney, Agent, or Firm* — Ked & Associates, LLP

(57) ABSTRACT

Disclosed is a touch window including a substrate, an electrode part on the substrate, a wire electrically connected with the electrode part, a wire pad to connect the wire with the electrode part, and a reinforcement electrode making contact with the wire pad. Provided is a touch device including a touch window, and a driving unit on the touch window, in which the touch window includes an electrode part to sense a position, a wire electrically connected with the electrode part, a wire pad to connect the wire with the electrode part, and a reinforcement electrode making contact with the wire pad.

18 Claims, 10 Drawing Sheets

Related U.S. Application Data continuation of application No. 15/886,399, filed on Feb. 1, 2018, now Pat. No. 10,082,908, which is a continuation of application No. 15/337,371, filed on Oct. 28, 2016, now Pat. No. 9,927,913, which is a continuation of application No. 14/595,363, filed on Jan. 13, 2015, now Pat. No. 9,898,125.

(51) Int. Cl.
*G06F 1/16* (2006.01)
*H01L 27/32* (2006.01)

(52) U.S. Cl.
CPC .......... *H01L 27/323* (2013.01); *G06F 1/1643* (2013.01); *G06F 2203/04102* (2013.01); *G06F 2203/04111* (2013.01); *H01L 27/3244* (2013.01)

(58) Field of Classification Search
CPC . G06F 2203/04112; G06F 2203/03113; G06F 1/1643; G06F 1/1652; H01L 27/323; H01L 27/3244
See application file for complete search history.

(56) References Cited

U.S. PATENT DOCUMENTS

| | | | |
|---|---|---|---|
| 2013/0002133 A1 | 1/2013 | Jin et al. | |
| 2013/0021289 A1 | 1/2013 | Chen et al. | |
| 2013/0081869 A1* | 4/2013 | Kim | G06F 3/044 174/261 |
| 2014/0231120 A1* | 8/2014 | Nakamura | B32B 15/14 174/253 |
| 2014/0293150 A1 | 10/2014 | Tang et al. | |
| 2015/0002756 A1 | 1/2015 | Kim et al. | |
| 2015/0185889 A1* | 7/2015 | Nakamura | G06F 3/044 345/173 |

FOREIGN PATENT DOCUMENTS

| | | | |
|---|---|---|---|
| WO | WO 2012/157555 | 11/2012 | |
| WO | WO-2012157555 A1 * | 11/2012 | ............. G06F 3/044 |
| WO | WO 2012/169864 | 12/2012 | |
| WO | WO 2013/089085 | 6/2013 | |
| WO | WO-2013089085 A1 * | 6/2013 | ............. B32B 15/14 |
| WO | WO 2015/093643 | 6/2015 | |

OTHER PUBLICATIONS

U.S. Final Office Action dated Dec. 5, 2016 issued in co-pending U.S. Appl. No. 14/595,363.
U.S. Office Action dated Jan. 26, 2017 issued in co-pending U.S. Appl. No. 15/337,371.
U.S. Office Action dated Mar. 28, 2017 issued in co-pending U.S. Appl. No. 14/595,363.
U.S. Final Office Action dated Jul. 14, 2017 issued in co-pending U.S. Appl. No. 15/337,371.
U.S. Notice of Allowance dated Oct. 5, 2017 issued in co-pending U.S. Appl. No. 14/595,363.
U.S. Notice of Allowance dated Nov. 2, 2017 issued in co-pending U.S. Appl. No. 15/337,371.
U.S. Office Action dated Apr. 5, 2018 issued in co-pending U.S. Appl. No. 15/886,399.
U.S. Notice of Allowance dated May 25, 2018 issued in co-pending U.S. Appl. No. 15/886,399.

* cited by examiner

TOUCH WINDOW AND TOUCH DEVICE INCLUDING THE SAME

CROSS-REFERENCE TO RELATED APPLICATIONS

This application is a Continuation Application of prior U.S. patent application Ser. No. 16/106,454, filed Aug. 21, 2018, which is a Continuation Application of prior U.S. patent application Ser. No. 15/886,399 filed Feb. 1, 2018, now U.S. Pat. No. 10,082,908, which is a Continuation Application of prior U.S. patent application Ser. No. 15/337,371, filed Oct. 28, 2016, now U.S. Pat. No. 9,927,913, which is a Continuation Application of prior U.S. patent application Ser. No. 14/595,363, filed Jan. 13, 2015, now U.S. Pat. No. 9,898,125, which claims priority under 35 U.S.C. § 119 to Korean Application No. 10-2014-0004112 filed on Jan. 13, 2014, whose entire disclosures are hereby incorporated by reference.

BACKGROUND

1. Field

The disclosure relates to a touch window and a touch device including the same.

2. Background

Recently, a touch panel, which performs an input function through the touch of an image displayed on a touch device by an input device, such as a stylus pen or a finger, has been applied to various electronic appliances.

The touch panel may be representatively classified into a resistive touch panel and a capacitive touch panel. The resistive touch panel detects the position of a touch by detecting resistance variance occurring according to the connection between electrodes when pressure is applied by the input device. The capacitive touch panel detects the position of the touch by detecting capacitance variation between the electrodes when the finger is touched on the touch panel. Recently, the capacitive touch panel has been spotlighted in a small-model device by taking into consideration the convenience in the manufacturing scheme and a sensing power.

Meanwhile, an electrode part of the touch panel is electrically connected with a wire, and the wire is connected with an external circuit, so that the touch panel can be driven. In this case, the electrode part and the wire may be disconnected from each other due to the variation in a design or the density. In addition, the wire may not be smoothly electrically connected with the wire, so that the characteristic of the touch panel may be degraded.

BRIEF DESCRIPTION OF THE DRAWINGS

The embodiments will be described in detail with reference to the following drawings in which like reference numerals refer to like elements wherein.

DETAILED DESCRIPTION

Figure 1:
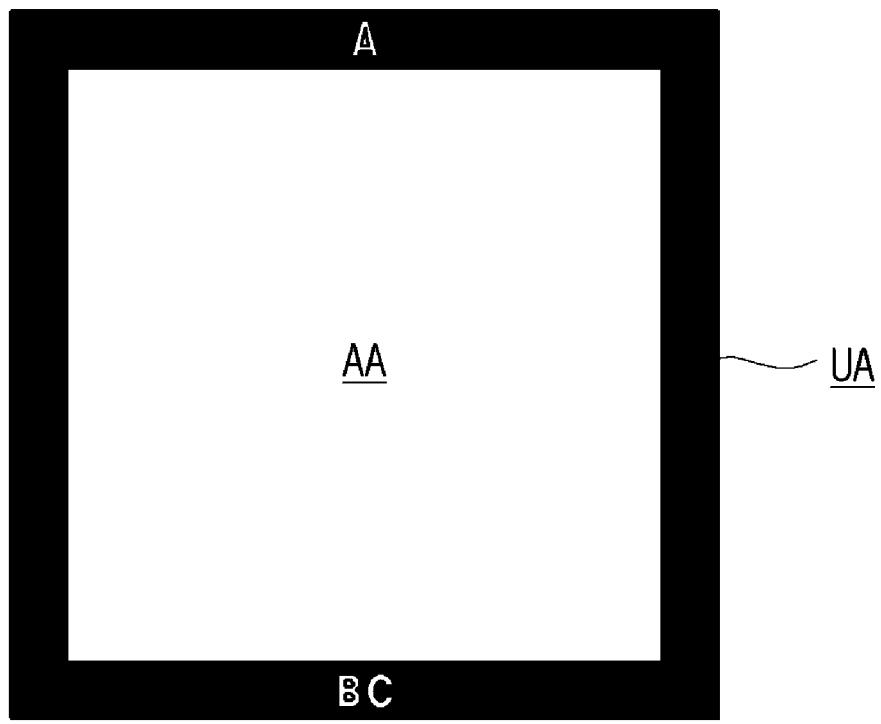
FIG. 1 is a plan view schematically showing a touch window according to the embodiment.

In the following description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings. The thickness and size of each layer (or film), each region, each pattern, or each structure shown in the drawings may be modified for the purpose of convenience or clarity of the explanation. In addition, the size of elements does not utterly reflect an actual size.

In the following description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

In the following description, when a part is connected to the other part, the parts are not only directly connected to each other, but also indirectly connected to each other while interposing another part therebetween. In addition, when a predetermined part "includes" a predetermined component, the predetermined part does not exclude other components, but may further include other components unless otherwise indicated.

Hereinafter, the embodiment will be described with reference to accompanying drawings.

A touch window according to the embodiment will be described below with reference to FIGS. 1 to 3.

Referring to FIG. 1, a touch window 10 according to the embodiment includes a substrate 100 having an active area AA to detect the position of an input device (e.g., finger) and an unactive area UA provided at a peripheral portion of the active area AA.

In this case, an electrode part 200 may be formed in the active area AA to detect the input device. In addition, a wire 300 may be formed in the unactive area UA for the electrical connection of the electrode part 200. In addition, an external circuit, which is connected with the wire 300, may be positioned in the unactive area UA.

If the input device, such as a finger, touches the touch window, the variation of capacitance occurs in the touched part by the input device, and the touched part subject to the variation of the capacitance may be detected as a touch point.

Hereinafter, the details of the touch window 10 will be described in more detail.

The substrate 100 may include various materials to support the electrode part 200, the wire 300, and a circuit board. For example, the substrate 100 may be rigid or flexible. For example, the substrate 100 may include a glass substrate or a plastic substrate. In detail, the substrate 100 may include chemically tempered/semi-tempered glass, such as soda lime glass or aluminosilicate glass, reinforced/flexible plastic, such as polyimide (PI), polyethylene terephthalate (PET), propylene glycol (PPG), or poly carbonate (PC), or sapphire.

In addition, the substrate 100 may include an optically isotropic film. For example, the substrate 100 may include cyclic olefin copolymer (COC), cyclic olefin polymer (COP), optically isotropic polycarbonate (PC), or optically isotropic PET.

The sapphire 100 has superior electric characteristics, such as permittivity, so that a touch response speed may be greatly increased and a space touch such as hovering may be easily implemented. In addition, since the sapphire has high surface hardness, the sapphire is applicable to a cover substrate. The hovering refers to a technique of recognizing coordinates even at a slight distance from a display.

In addition, the substrate 100 is bendable with a partially curved surface. In other words, the substrate 100 is bendable while a portion of the substrate 100 has a flat surface and another portion of the substrate 100 has a curved surface. In detail, an end portion of the substrate 100 may be bent with a curved surface or may be curved or bent with a surface having a random curvature.

In addition, the substrate 100 may include a flexible substrate having a flexible property.

In addition, the substrate 100 may include a curved substrate or a bended substrate. In other words, the touch window including the substrate 100 may be formed with a flexible, curving, or bending characteristic. Accordingly, the touch window according to the embodiment can be easily carried by a user and may be modified to touch windows having various designs.

The outer dummy layer is formed in the unactive area UA of the substrate 100. The outer dummy layer may be coated with a material having a predetermined color so that the wire 300 and a printed circuit board connecting the wire 300 to the external circuit cannot be viewed from the outside. The outer dummy layer may have a color suitable for a desired outer appearance thereof. For example, the outer dummy layer includes black or white pigments to represent black or white. In addition, various colors are employed so that various colors, such as red and blue, can be represented. In addition, a desired logo may be formed in the outer dummy layer through various schemes. The outer dummy layer may be formed through deposition, print, and wet coating schemes. The outer dummy layer may be provided in at least one layer. For example, the outer dummy layer may be provided in one layer or may be provided in at least two layer having widths mutually different from each other.

Thereafter, the electrode part 200 may be formed in the active area AA to detect the input device.

Figure 2:
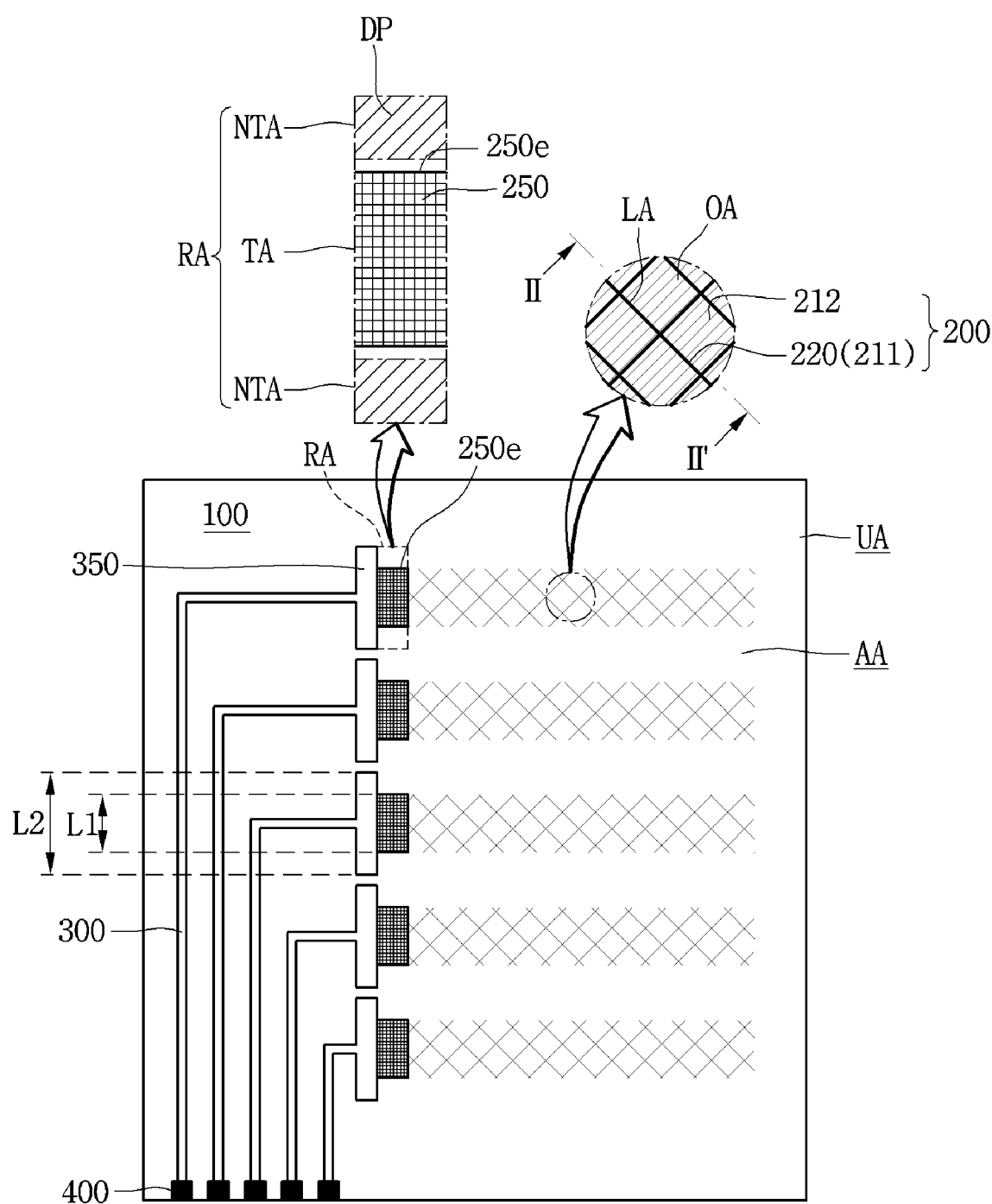
FIG. 2 is a plan view showing a touch window according to one embodiment.

Although FIG. 2 shows that the electrode part 200 is formed in the shape of a bar, the embodiment is not limited thereto. Accordingly, the electrode part 200 may be formed in various shapes to detect the touch by the input device, such as a finger.

Although FIG. 2 shows that the electrode part 200 extends in one direction, the embodiment is not limited thereto. Therefore, the electrode part 200 may include two types of electrode parts, in which one type of an electrode part extends in one direction, and the other type of electrode part extends in a different direction crossing the one direction.

If the input device, such as a finger, touches the touch window, the variation of capacitance occurs in the touched part by the input device, and the touched part subject to the variation of the capacitance may be detected as a touch point.

The electrode part 200 may include a conductive pattern. For example, the electrode part 200 may be provided in a mesh shape. In this case, the mesh shape may be randomly formed to prevent a Moire phenomenon. The Moire phenomenon occurs when striped patterns are overlapped with each other. As adjacent striped patterns are overlapped with each other, the thickness of the striped patterns is increased, so that the overlapped striped patterns more stand out as compared with other stripped patterns. In order to overcome the Moire phenomenon, various conductive patterns may be provided.

In detail, the electrode part 200 includes a conductive pattern opening OA and a conductive pattern line part LA. In this case, the line width T1 of the conductive pattern line part LA may be in the range of 0.1 μm to 10 μm. The conductive pattern line part LA having the line width T1 of 0.1 μm or less may not be formed due to the characteristic of the manufacturing process or may cause the short between mesh lines. If the line width T1 exceeds 10 μm, the electrode pattern is viewed from the outside so that the visibility may be degraded. Preferably, the line width T1 of the conductive pattern line part LA may be in the range of 0.5 μm to 7 μm. More preferably, the line width T1 of the conductive pattern line part LA may be in the range of 1 μm to 3.5 μm.

Meanwhile, as shown in FIG. 2, the conductive patterns may be regularly formed. In other words, the conductive pattern opening OA may have the shape of a rectangle, but the embodiment is not limited thereto. The conductive pattern opening OA may have various shapes such as a polygonal shape including a diamond shape, a pentagonal shape, or a hexagonal shape, or a circular shape.

In addition, the embodiment is not limited thereto, but the conductive patterns may have irregular shapes. In other words, various conductive pattern openings may be provided in one conductive pattern. Therefore, the electrode part 200 may include conductive pattern openings having various shapes.

As the electrode part 200 has the mesh shape, the pattern of the electrode part 200 may not be viewed in the active area AA. In other word, even if the electrode part 200 includes metal, the pattern of the electrode part 200 may not be viewed. In addition, even if the electrode part 200 is applied to a large touch window, the resistance of the touch window may be lowered. Further, the electrode part 200 includes a conductive pattern to improve printing quality, so that the high-quality touch window can be ensured.

Figure 3:
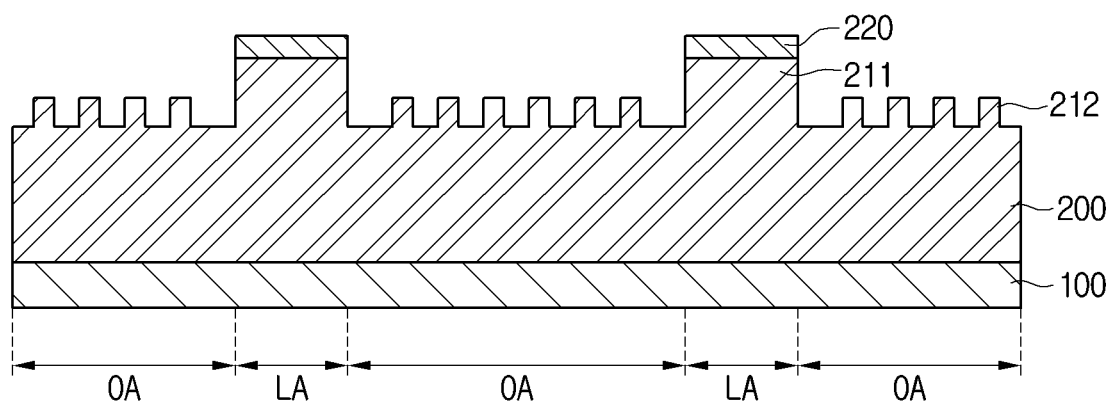
FIG. 3 is a sectional view taken along line I-I' of FIG. 2.

Referring to FIG. 3, the electrode part 200 may include a first sub-pattern 211, a second sub-pattern 212, and an electrode layer 220.

The first sub-pattern 211 is provided on the substrate 100. The first sub-pattern 211 is provided in the mesh line part LA. Accordingly, the first sub-pattern 211 may be provided in the mesh shape. The first sub-pattern 211 may be an embossed pattern.

The second sub-pattern 212 is provided on the substrate 100. The second sub-pattern 212 is provided in the mesh opening OA. Accordingly, the second sub-pattern 212 may be interposed between first sub-patterns 211. The second sub-pattern 212 may be an embossed pattern. The second sub-pattern 212 may be formed an area other than the electrode part 200. The second sub-pattern 212 may be formed in the active area AA and the unactive area UA.

The first sub-pattern 211 and the second sub-pattern 212 may include resin or polymer.

The electrode layer 220 is provided on the first sub-pattern 211. Accordingly, the electrode layer 220 is provided on the mesh line part LA. The electrode layer 220 may be provided in the mesh shape. The electrode layer 220 may include various metals representing superior electricity. For example, the electrode layer 220 may include Cu, Au, Ag, Al, Ti, Ni, or the alloy thereof.

Meanwhile, the embodiment is not limited thereto, but the conductive pattern may be provided in an intaglio pattern. In detail, referring to FIG. 4, a resin layer 150 may be provided on an electrode substrate 130, and may include an intaglio part 150a. In this case, the electrode layer 220 may be provided in the intaglio part 150a. In other words, the electrode part 200 may be formed by filling an electrode material into the intaglio part 150a. Therefore, when comparing conventional deposition and photolithography processes, the number of processes, the process time, and the process cost can be reduced.

Figure 5:
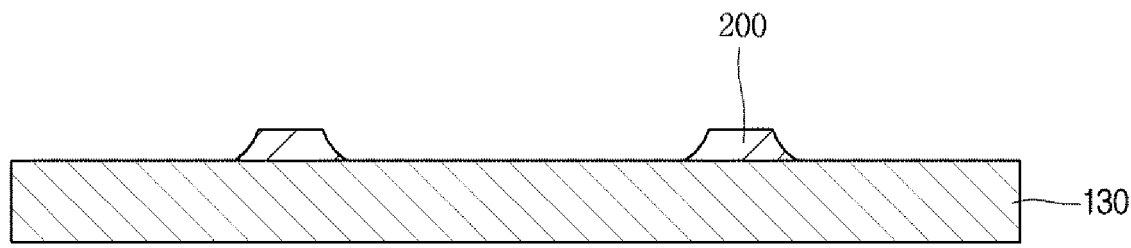

Referring to FIG. 5, the electrode part 200 having a conductive pattern may be formed by etching a metallic material on the electrode substrate 130. For example, after depositing copper (Cu) on the electrode substrate 130 including poly(ethylene terephthalate), the copper layer is etched to form a copper metal mesh electrode having an embossed mesh shape.

Figure 6:
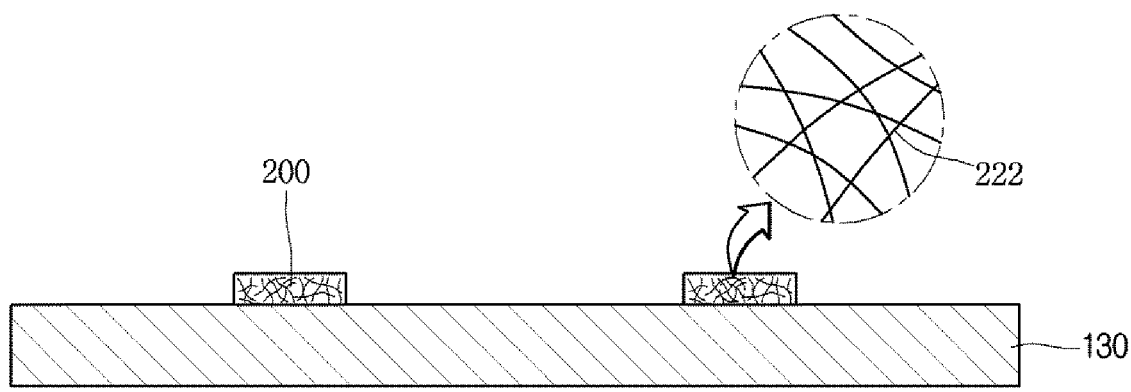

Referring to FIG. 6, the electrode part 200 may include an interconnecting structure 222. The interconnecting structure 222 may include a fine structure having a diameter in the range of 10 nm to 200 nm. For example, the interconnecting structure 222 may have a fine structure having a diameter in a range of 20 nm to 100 nm. For example, the electrode part 200 may include a nanowire. The electrode part 200 may include a metallic nanowire.

Figure 7:
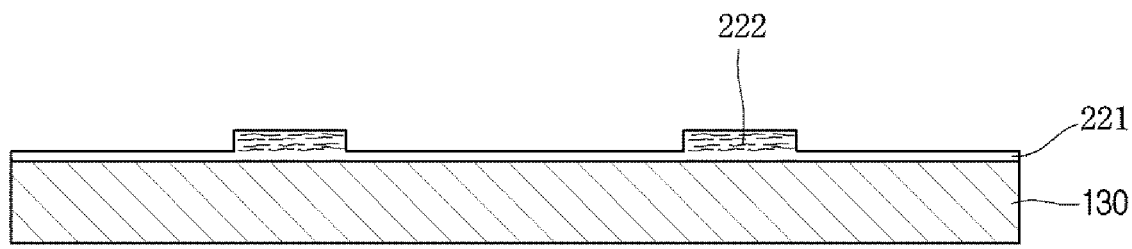

Referring to FIG. 7, the electrode part 200 may include a base material 221 and a nanowire 222. The base material 221 includes a photosensitive material. The base material 221 includes the photosensitive material, so that the electrode part 200 may be formed through the exposure and development processes.

The electrode part 200 may include a photosensitive nanowire film. The electrode part 200 includes the photosensitive nanowire film, so that the thickness of the electrode part 200 may be reduced. In other words, the electrode part 200 may include nanowires and the whole thickness of the electrode part 200 may be reduced. According to the related art, when the electrode part 200 includes nanowires, an overcoating layer must be additionally formed to prevent the nanowires from being oxidized. Accordingly, the processes may be complicated, and the thickness of the touch window may be increased. However, according to the present embodiment, the nanowires are provided in the photosensitive materials, so that the nanowires can be prevented from being oxidized without the overcoating layer.

Subsequently, a wire 300 is provided on the unactive area UA for the electrical connection of the electrode part 200. In other words, the wire 300 may apply an electrical signal to the electrode part 200. For example, the wire 300 may include chromium (Cr), nickel (Ni), copper (Cu), aluminum (Al), silver (Ag), molybdenum (Mo), and the alloy thereof. In particular, the wire 300 may include various metallic paste materials allowing a printing process.

A wire pad 350 is interposed between the electrode part 200 and the wire 300. The wire pad 350 may electrically connect the electrode part 200 with the wire 300. The wire pad 350 may include a material the same as or similar to a material constituting the wire 300.

Meanwhile, the reinforcement electrode 250 is interposed between the electrode part 200 and the wire 300. The reinforcement electrode 250 directly makes contact with the electrode part 200. The reinforcement electrode 250 directly makes contact with the wire pad 350. In addition, the reinforcement electrode 250 may be provided on the electrode part 200. In detail, the reinforcement electrode 250 may be provided on the electrode layer 220.

The reinforcement electrode 250 may include a material the same as or similar to a material of the electrode part 200.

The reinforcement electrode may include a conductive pattern. The reinforcement electrode 250 may be provided in a mesh shape. The conductive pattern of the reinforcement electrode 250 may be different from that of the electrode part 200. In other words, a pattern of the reinforcement electrode 250 may be different from that of the electrode part 200.

Figure 4:
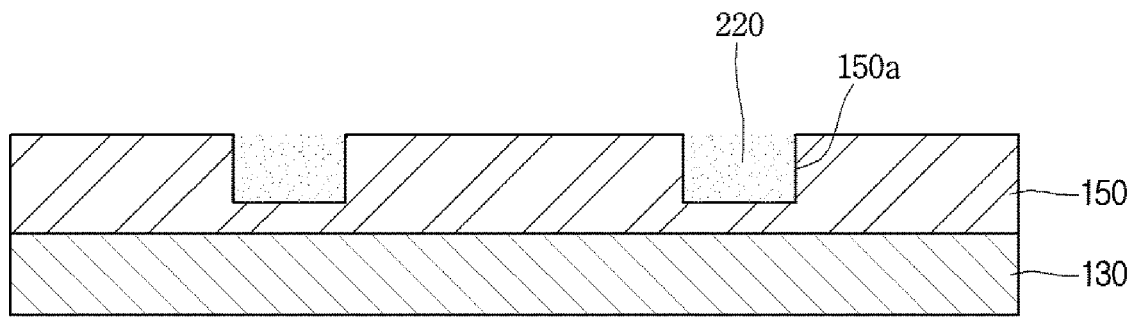
FIGS. 4 to 7 are sectional views showing touch windows according to other embodiments.

The conductive pattern of the reinforcement electrode 250 may be formed through a scheme the same as or similar to that used to form a conductive pattern of the electrode part 200. In other words, as shown in FIG. 3, the reinforcement electrode 250 may be formed by first and second sub-patterns. In addition, as shown in FIG. 4, the reinforcement electrode 250 may be formed by filling an electrode material in an intaglio pattern. Further, as shown in FIG. 5, the reinforcement electrode 250 may be formed through an etching process. In addition, as shown in FIG. 6, the reinforcement electrode 250 may be formed using an interconnecting structure. Further, as shown in FIG. 7, the reinforcement electrode 250 may be formed by using a photosensitive nanowire film.

The reinforcement electrode 250 includes an edge pattern 250e to surround an edge of the reinforcement electrode 250. The electrical characteristic of the reinforcement electrode 250 may be improved through the edge pattern 250e.

Meanwhile, a length L1 of the reinforcement electrode 250 may be shorter than a length L2 of the wire pad 350. Therefore, the reinforcement electrode 250 may make contact with a portion of the wire pad 350.

In detail, a reinforcement area RA, which is defined between the wire pad 350 and the electrode part 200, may include a contact area TA and a non-contact area NTA.

The contact area TA is an area in which the reinforcement electrode 250 is provided. Meanwhile, the non-contact area NTA is provided adjacent to the contact area TA. In other words, the non-contact area NTA is an area in which the reinforcement electrode 250 is not provided. Non-contact areas NTA may be provided up and down the contact area TA.

A dummy pattern DP may be further provided in the non-contact area NTA. In other words, the dummy pattern DP may be provided at an end portion of the reinforcement electrode 250. The dummy pattern DP is a pattern that does not serve as an electrode. The electrode layer 220 of the electrode part 200 may have a fine line width due to the dummy pattern DP. The dummy pattern DP may be a portion of the second sub-pattern 212. In other words, the second sub-pattern 212 may include the dummy pattern DP.

Therefore, the number of mesh lines making contact with the wire 300 is increased due to the reinforcement electrode 250, so that the electrode part 200 can be prevented from being disconnected from the wire 300. In addition, the rapid density change between the electrode part 200 and the wire 300 can be reduced due to the reinforcement electrode 250, so that the electrical characteristic can be improved.

In addition, the reinforcement electrode 250 can sufficiently ensure the contact area of the wire 300. In other words, when comparing with the case that the electrode part 200 is directly connected with the wire 300, the contact area can be more increased since the electrode part 200 is connected with the wire 300 through the reinforcement electrode 250. Therefore, the reinforcement electrode 250 prevents the disconnection between the electrode part 200 and the wire 300, so that the electrical characteristic of the touch window can be improved. In addition, even if the electrode layer 220 of the electrode part 200 is cracked, the electrode part 200 may be electrically connected with the wire 300 through the reinforcement electrode 250, so that the reliability of the electrode part 200 may be improved. The electrode pad 400 may be connected with a printed circuit board. Although not shown in drawings, a connector is positioned on any one surface of the printed circuit board, and the electrode pad 400 may be connected with the connector. The electrode pad 400 may have a size corresponding to that of the connector.

The printed circuit board may employ various types of printed circuit boards. For example, a flexible printed circuit board (FPCB) may be employed.

Figure 8:
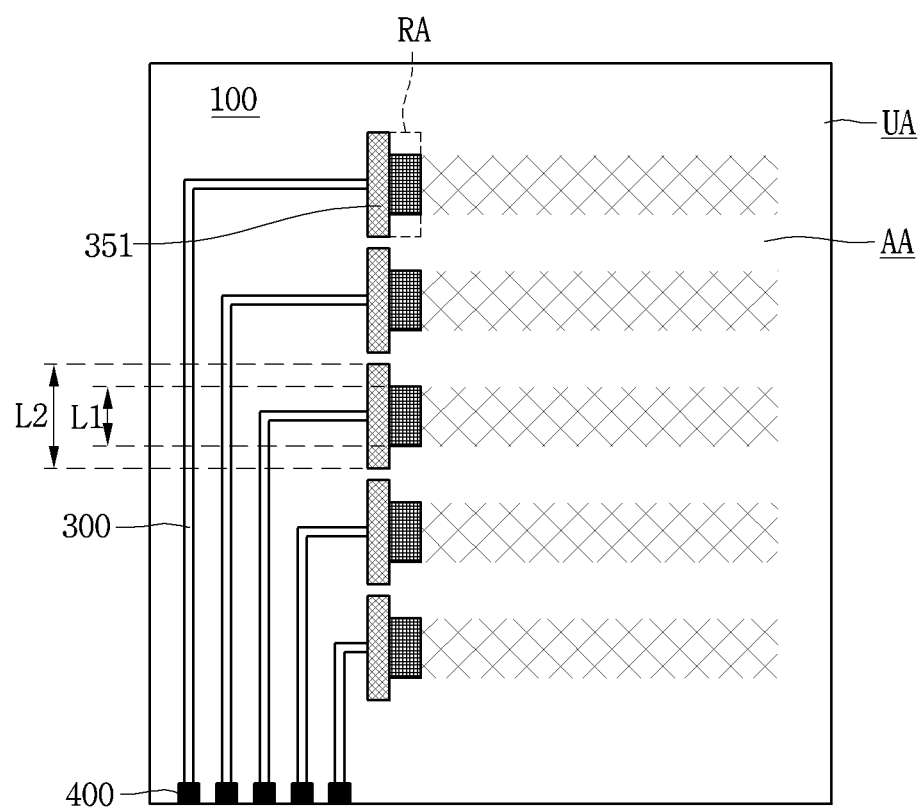
FIG. 8 is a plan view showing a touch window according to another embodiment.

Hereinafter, a touch window according to another embodiment will be described with reference to FIG. 8. In the following description, the details of the structures and the components the same as or similar to those described above will be omitted for the clear and brief explanation.

A wire pad 351 of the touch window according to another embodiment includes a conductive pattern. In other words, the wire pad 351 may have a mesh shape. The conductive pattern of the wire pad 351 may be different from the conductive pattern of the reinforcement electrode 250. In other words, patterns to form the wire pad 351 and the reinforcement electrode 250 may be different from each other.

The conductive pattern of the wire pad 351 may be formed through a scheme the same as or similar to that used to form a conductive pattern of the electrode part 200. In other words, as shown in FIG. 3, the wire pad 351 may be formed by the first and second sub-patterns. In addition, as shown in FIG. 4, the wire pad 351 may be formed by filling an electrode material in an intaglio pattern. Further, as shown in FIG. 5, the wire pad 351 may be formed through an etching process. In addition, as shown in FIG. 6, the wire pad 351 may be formed by using an interconnecting structure. Further, as shown in FIG. 7, the wire pad 351 may be formed by using a photosensitive nanowire film.

The wire pad 351 includes a conductive pattern, so that the wire pad 351 is not viewed. Therefore, a Bezel, which is used to hide the wire pad 351, may be omitted. Accordingly, a wider active area AA can be ensured. In addition, the electrical characteristic can be improved due to the wire pad 351.

FIGS. 9 to 12 are views showing a touch device in which the touch window according to the embodiment is provided on a driving part.

Figure 9:
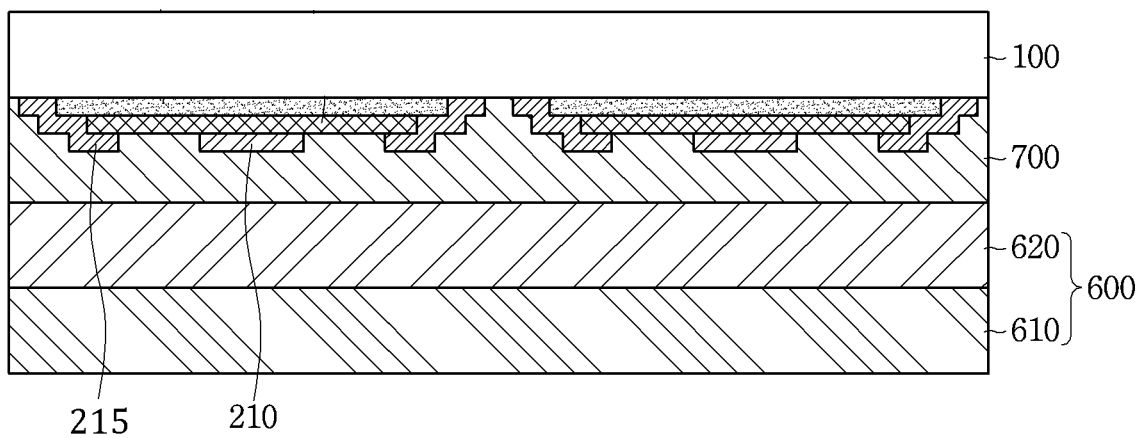
FIGS. 9 to 12 are views showing a touch device in which the touch window according to the embodiment is provided on a driving part.
Figure 10:
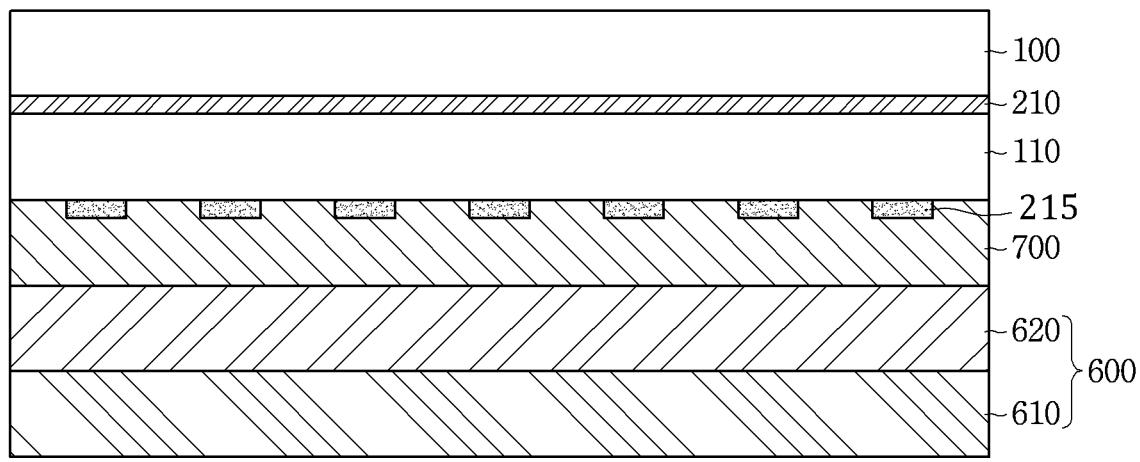

Referring to FIGS. 9 and 10, the touch device according to the embodiment may include a touch panel provided on a display panel 600.

In detail, referring to FIG. 9, the touch device may be formed by combining the substrate 100 with the display panel 600. The substrate 100 may be bonded to the display panel 600 through an adhesive layer 700. For example, the substrate 100 may be combined with the display panel 600 through the adhesive layer 700 including an optical clear adhesive (OCA).

Referring to FIG. 10, when a substrate 110 is additionally provided on the substrate 100, the touch device may be formed by combining the substrate 110 with the display panel 600. The substrate 110 may be combined with the display panel 600 through the adhesive layer 700 including the OCA.

The display panel 600 may include first and second substrates 610 and 620.

When the display panel 600 is a liquid crystal display panel, the display panel 600 may be formed in a structure in which the first substrate 610 including a thin film transistor (TFT) and a pixel electrode is combined with the second substrate 620 including a color filter layer while the first and second substrates 610 and 620 interpose a liquid crystal layer therebetween.

In addition, the display panel 600 may be a liquid crystal display panel having a COT (color filter on transistor) structure in which the second substrate 620 is combined with the first substrate 610 on which a thin film transistor, a color filter and a black matrix are formed while a liquid crystal layer is interposed between the first and second substrates 610 and 620. That is, the thin film transistor is formed on the first substrate 610, the protective layer is formed on the thin film transistor, and the color filter layer is formed on the protective layer. In addition, the pixel electrode making contact with the thin film transistor is formed on the first substrate 610. In this case, in order to improve an aperture rate and simplify a mask process, the black matrix may be omitted and a common electrode may be formed to serve as the black matrix.

In addition, when the display panel 600 is a liquid crystal panel, the display device may further include a backlight unit for providing light from the rear surface of the display panel 600.

When the display panel 600 is an organic light emitting device, the display panel 600 includes a self light-emitting device which does not require any additional light source. A thin film transistor is formed on the first substrate 610 of the display panel 600, and an organic light emitting device (OLED) making contact with the thin film transistor is formed. The OLED may include an anode, a cathode and an organic light-emitting layer formed between the anode and the cathode. In addition, the second substrate 620 may be further formed on the organic light demitting device to perform the function of an encapsulation substrate for encapsulation.

Figure 11:
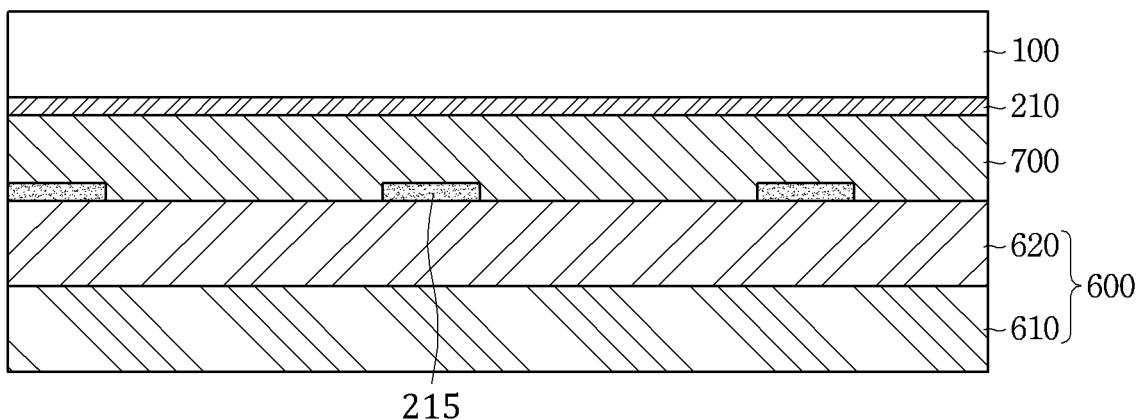

Referring to FIG. 11, the touch device according to the embodiment may include a touch panel integrated with the touch panel 600. In other words, a substrate to support at least one sensing electrode may be omitted.

In detail, at least one sensing electrode may be provided on at least one surface of the display panel 600. In other words, at least one sensing electrode may be formed on at least one surface of the substrate 610 or the second substrate 620.

Referring to FIG. 11, a first sensing electrode 210 may be provided on one surface of the substrate 100. In addition, a first wire connected with the first sensing electrode 210 may be provided. In addition, a second sensing electrode 215 may be provided on one surface of the display panel 600. In addition, a second wire connected with the second sensing electrode 215 may be provided.

The adhesive layer 700 is interposed between the substrate 100 and the display panel 600, so that the substrate 100 can be combined with the display panel 600.

In addition, the polarizing plate may be provided under the substrate 100. The polarizing plate may be a linear polarizing plate or an anti-reflection polarizing plate. For example, when the display panel 600 is a liquid crystal display panel, the polarizing plate may be a linear polarizing plate. In addition, when the display panel 600 is an organic electroluminescent display panel, the polarizing plate may be an anti-reflection polarizing plate.

According to the touch device of the embodiment, at least one substrate to support the sensing electrode may be omitted. Accordingly, a thin and light touch device may be formed.

Figure 12:
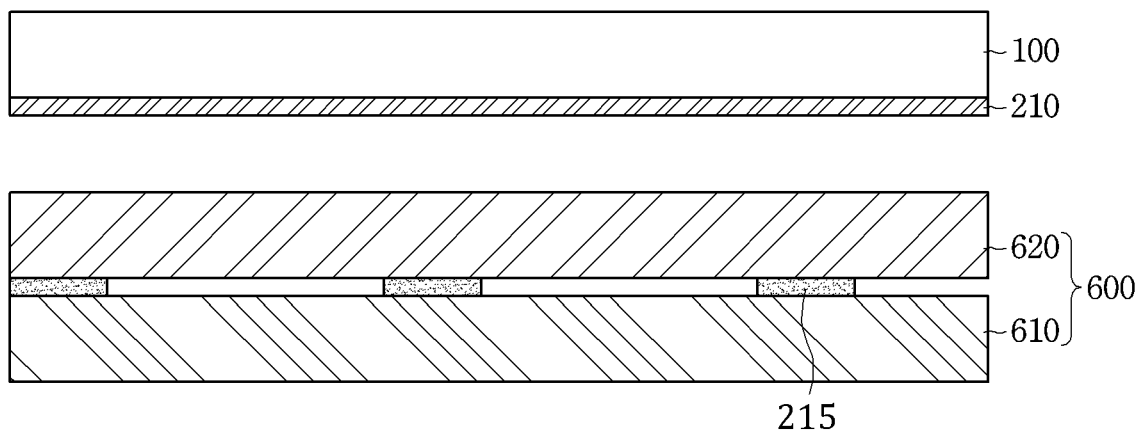

Referring to FIG. 12, a touch device according to the embodiment may include a touch panel formed integrally with the display panel 600. In other words, a substrate to support at least one sensing electrode may be omitted.

A sensing electrode, which serves as a sensor disposed in an active area to sense a touch, and a wire to apply an electrical signal to the sensing electrode may be formed inside the display panel. In detail, at least one sensing electrode or at least one wire may be formed inside the display panel.

The display panel includes first and second substrates 610 and 620. In this case, at least one of the first and second sensing electrodes 210 and 215 is disposed between the first and second substrates 610 and 620. That is, at least one sensing electrode may be formed on at least one surface of the first or second substrate 610 or 620.

Referring to FIG. 12, the first sensing electrode 210 may be provided on one surface of the substrate 100. In addition, the first wire connected with the first sensing electrode 210 may be provided. In addition, the second sensing electrode 215 and the second wire may be interposed between the first and second substrates 610 and 620. In other words, the second sensing electrode 215 and the second wire are provided inside the display panel, and the first sensing electrode 210 and the first wire may be provided outside the display panel.

The second sensing electrode 215 and the second wire may be provided on the top surface of the first substrate 610 or the rear surface of the second substrate 620.

A polarizing plate may be additionally provided under the substrate 100.

When the display panel is a liquid crystal display panel and the sensing electrode is formed on the top surface of the first substrate 610, the sensing electrode may be formed together with a thin film transistor (TFT) or a pixel electrode. In addition, when the sensing electrode is formed on the rear surface of the second substrate 620, a color filter layer may be formed on the sensing electrode or the sensing electrode may be formed on the color filter layer. When the display panel is an organic light emitting device and the sensing electrode is formed on the top surface of the first substrate 610, the sensing electrode may be formed together with a thin film transistor or an organic light emitting device.

According to the touch device of the embodiment, at least one substrate to support the sensing electrode may be omitted. Accordingly, a thin and light touch device may be formed. In addition, the sensing electrode and the wire are formed together with the device formed on the display panel, so that the process can be simplified and the cost can be reduced.

FIGS. 13 to 16 are views to explain a display device employing the touch window according to the embodiment.

Figure 13:
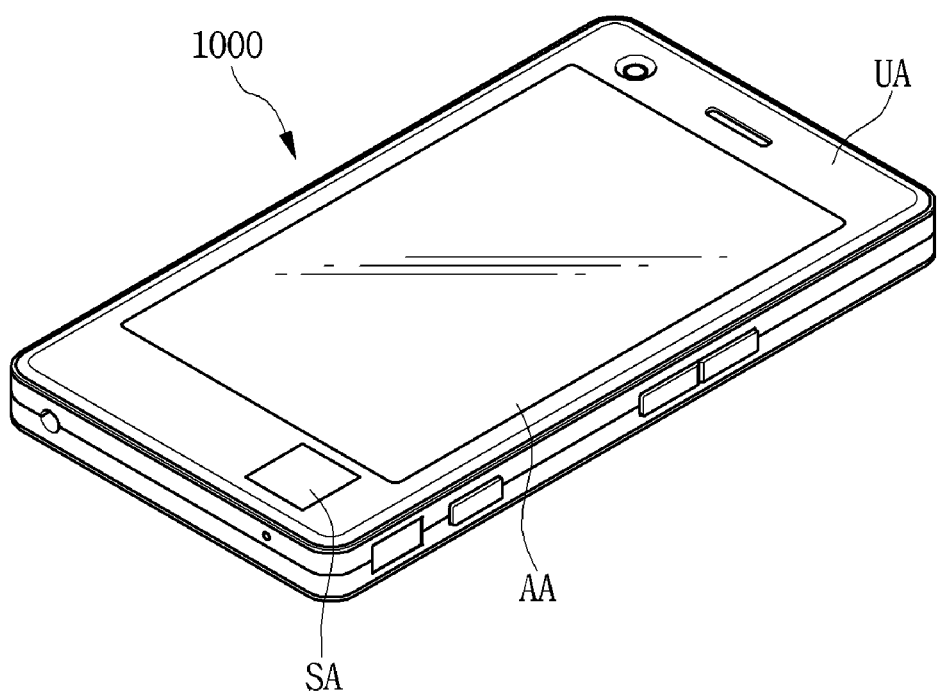
FIGS. 13 to 16 are views to explain a display device employing the touch window according to the embodiment.

Referring to FIG. 13, a mobile terminal is shown as an example of a touch device. The mobile terminal may include an active area AA and an unactive area UA. In the active area AA, a touch signal generated due to the touch by a finger is sensed, and a command icon part and a logo may be formed in the unactive area UA.

Figure 14:
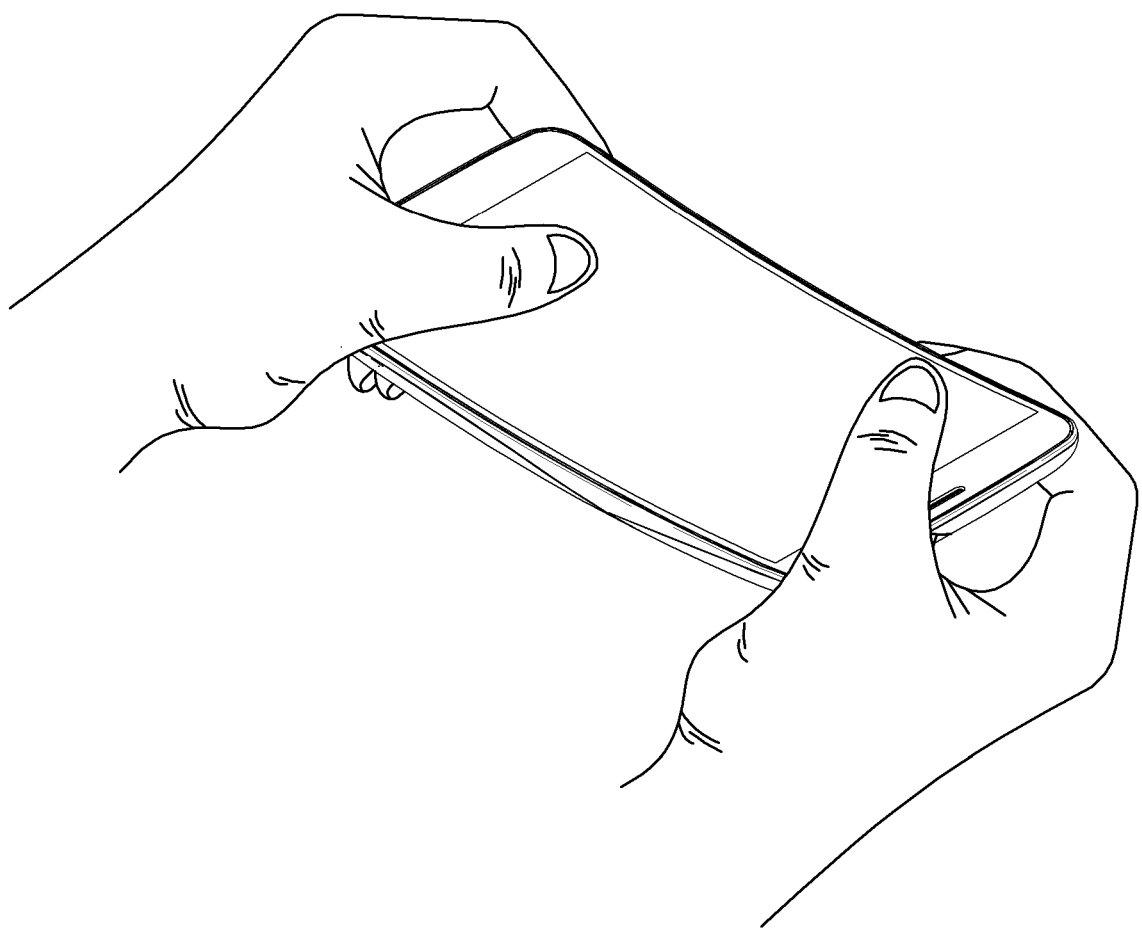

Referring to FIG. 14, a touch window may include a flexible touch window. Accordingly, the touch device including the flexible touch window may be a flexible touch device. Accordingly, a user may curve or bend the touch device with a hand. The flexible touch window may be applied to a wearable touch scheme.

Figure 15:
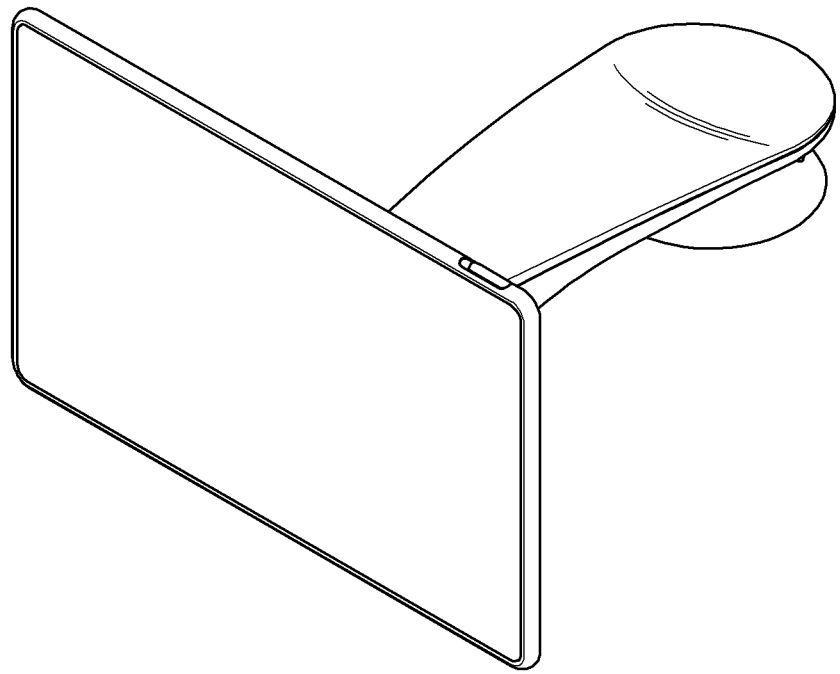

Referring to FIG. 15, the touch window may be applied to a vehicle navigation as well as the touch device such as the mobile terminal.

Figure 16:

Referring to FIG. 16, the touch window may be applied into a vehicle. In other words, the touch window may be applied to various parts in the vehicle, which allow the application of the touch window. Accordingly, the touch window is applied to a dashboard as well as a PND (Personal Navigation Display), thereby realizing a CID (Center Information Display). However, the embodiment is not limited to the embodiment. In other words, the display may be used in various electronic products.

The embodiment provides a touch window having improved reliability and a touch device including the same.

According to the embodiment, there is provided a touch window including a substrate, an electrode part on the substrate, a wire electrically connected with the electrode part, a wire pad to connect the wire with the electrode part, and a reinforcement electrode making contact with the wire pad.

According to the embodiment, there is provided a touch device including a touch window, and a driving unit on the touch window. The touch window includes an electrode part to sense a position, a wire electrically connected with the electrode part, a wire pad to connect the wire with the electrode part, and a reinforcement electrode making contact with the wire pad.

As described above, the touch window according to the embodiment includes the reinforcement electrode interposed between the electrode part and the wire. The reinforcement electrode can ensure the sufficient contact area with the wire. In other words, when comparing with the case that the electrode part is directly connected with the wire, the contact area can be more increased since the electrode part is connected with the wire through the reinforcement electrode. The reinforcement electrode can prevents the electrode part from being disconnected from the wire, so that the electrical characteristic of the touch window can be improved. Even if the electrode part is cracked, the electrode part can be electrically connected with the wire through the reinforcement electrode, so that the reliability of the electrode part can be improved.

In particular, when the electrode part has the mesh shape, the rapid density change between the electrode part and the wire can be reduced due to the reinforcement electrode, so that the electrical characteristic can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A touch window comprising:
a substrate;
a cover substrate on the substrate;
an electrode part on the substrate;
a plurality of reinforcement electrodes on the substrate;
a plurality of wires on the substrate; and
a plurality of wire pads on the substrate,
wherein the electrode part includes a plurality of first sensing electrodes and a plurality of second sensing electrodes,
wherein the plurality of first sensing electrodes extend in a first direction on a first surface of the substrate, and the first surface is in a direction of the cover substrate,
wherein the plurality of second sensing electrodes extend in a second direction that crosses the first direction on a second surface of the substrate, and the second surface is opposite of the first surface,
wherein the plurality of wires include a plurality of first wires electrically connecting with the plurality of first sensing electrodes, and a plurality of second wires electrically connecting with the plurality of second sensing electrodes,
wherein the plurality of reinforcement electrodes include a plurality of first reinforcement electrodes connecting with the plurality of first sensing electrodes, and a plurality of second reinforcement electrodes connecting with the plurality of second sensing electrodes,
wherein the plurality of wire pads include a plurality of first wire pads connecting with the plurality of first wires, and a plurality of second wire pads connecting with the plurality of second wires,
wherein the first wire pads electrically connect the first wires to the first sensing electrodes and the first reinforcement electrodes,
wherein the second wire pads electrically connect the second wires to the second sensing electrodes and the second reinforcement electrodes,
wherein the first reinforcement electrodes and the second reinforcement electrodes include a plurality of conductive patterns,
wherein a reinforcement area is defined between one of the wire pads and the electrode part and includes a contact area and a non-contact area,
wherein the contact area contacts the electrode part,
wherein the non-contact area is positioned adjacent to the contact area and does not contact the electrode part,
wherein the non-contact area is provided at both end portions in a width direction of the electrode part from the contact area,
wherein a length of the non-contact area at one of the end portions in the width direction of the electrode part from the contact area is greater than a distance between two adjacent ones of the wire pads,
wherein the first sensing electrodes and the second sensing electrodes include a mesh pattern,
wherein the mesh pattern of the first sensing electrodes and the second sensing electrodes includes a mesh opening and a mesh line part,
wherein the mesh line part of the first sensing electrodes has a plurality of first mesh lines parallel to each other and a plurality of second mesh lines parallel to each other that cross the first mesh lines, and
wherein a distance between two adjacent ones of the first mesh lines or the second mesh lines is larger than the distance of between two adjacent ones of the wire pads.

2. The touch window of claim 1, wherein a length of each non-contact area in the width direction of the electrode part is greater than the distance between two adjacent ones of the wire pads.

3. The touch window of claim 1, wherein an area between two adjacent ones of the wire pads is disposed in an area between two adjacent ones of the non-contact areas.

4. The touch window of claim 1, wherein a length of the first reinforcement electrodes, which is a length from one end to another end parallel to a longitudinal direction of the first wire pads, is less than a length of the first wire pads.

5. The touch window of claim 1, wherein a length of the second reinforcement electrodes, which is a length from one end to another end parallel to a longitudinal direction of the second wire pads, is less than a length of the second wire pads.

6. The touch window of claim 1, wherein a first electrode pad electrically connects the first wires and a circuit board.

7. The touch window of claim 1, wherein a shape of one of the conductive patterns of the first reinforcement electrodes and the second reinforcement electrodes differs from the mesh pattern of the first sensing electrodes and the second sensing electrodes.

8. The touch window of claim 1, wherein the first sensing electrodes, the first reinforcement electrodes, and the first wires are positioned on the first surface of the substrate,
wherein the second sensing electrodes, the second reinforcement electrodes, and the second wires are positioned on the second surface of the substrate.

9. The touch window of claim 1, wherein the first and second sensing electrodes, the first and second reinforcement electrodes, the first and second wires, and the first and second wire pads include metal.

10. The touch window of claim 1, wherein the substrate includes at least one of a glass or polyethylene terephthalate (PET).

11. The touch window of claim 1, wherein lengths of the first reinforcement electrodes are greater than widths of the first reinforcement electrodes, and lengths of the second reinforcement electrodes are greater than widths of the second reinforcement electrodes.

12. The touch window of claim 1, wherein the first and second sensing electrodes, the first and second reinforcement electrodes, and the first and second wires are positioned on a same surface of the substrate.

13. The touch window of claim 1, wherein a width of the first wire pads is less than a width of the first reinforcement electrodes, and wherein a width of the second wire pads is less than a width of the second reinforcement electrodes.

14. The touch window of claim 1, wherein the substrate has a flat surface and a curved surface, and wherein a distal end of the substrate is bent corresponding to the curved surface.

15. The touch window of claim 1, further comprising an outer dummy layer on the cover substrate.

16. The touch window of claim 1, further comprising a dummy pattern that does not contact the electrode part and is provided in the non-contact area.

17. The touch window of claim 16, wherein the dummy pattern is provided at the both end portions in the width direction of the electrode part from the contact area.

18. A touch device comprising:
a display panel; and
a touch window on the display panel,
wherein the touch window includes:
a substrate;
a cover substrate on the substrate;
an electrode part on the substrate;
a plurality of reinforcement electrodes on the substrate;
a plurality of wires on the substrate; and
a plurality of wire pads on the substrate,
wherein the electrode part includes a plurality of first sensing electrodes and a plurality of second sensing electrodes,
wherein the plurality of first sensing electrodes extend in a first direction on a first surface of the substrate, and the first surface is in a direction of the cover substrate,
wherein the plurality of second sensing electrodes extend in a second direction that crosses the first direction on a second surface of the substrate, and the second surface is opposite of the first surface,
wherein the plurality of wires include a plurality of first wires electrically connecting with the plurality of first sensing electrodes, and a plurality of second wires electrically connecting with the plurality of second sensing electrodes,
wherein the plurality of reinforcement electrodes include a plurality of first reinforcement electrodes connecting with the plurality of first sensing electrodes, and a plurality of second reinforcement electrodes connecting with the plurality of second sensing electrodes,
wherein the plurality of wire pads include a plurality of first wire pads connecting with the plurality of first wires, and a plurality of second wire pads connecting with the plurality of second wires,
wherein the first wire pads electrically connect the first wires to the first sensing electrodes and the first reinforcement electrodes,
wherein the second wire pads electrically connect the second wires to the second sensing electrodes and the second reinforcement electrodes,
wherein the first reinforcement electrodes and the second reinforcement electrodes include a plurality of conductive patterns,
wherein a reinforcement area is defined between one of the wire pads and the electrode part, and includes a contact area and a non-contact area,
wherein the contact area contacts the electrode part,
wherein the non-contact area is positioned adjacent to the contact area and does not contact the electrode part,
wherein the non-contact area is provided at both end portions in a width direction of the electrode part from the contact area,
wherein a length of the non-contact area at one end of the portions in the width direction of the electrode part from the contact area is greater than a distance between two adjacent ones of the wire pads,
wherein the first sensing electrodes and the second sensing electrodes include a mesh pattern,
wherein the mesh pattern of the first sensing electrodes and the second sensing electrodes includes a mesh opening and a mesh line part,
wherein the mesh line part of the first sensing electrodes has a plurality of first mesh lines parallel to each other and a plurality of second mesh lines parallel to each other that cross the first mesh lines,
wherein a distance between two adjacent ones of the first mesh lines or the second mesh lines is larger than the distance between two adjacent ones of the wire pads.

* * * * *